(12) United States Patent
Galili et al.

(10) Patent No.: US 9,071,279 B2
(45) Date of Patent: Jun. 30, 2015

(54) TURBO DECODER INPUT REORDERING

(75) Inventors: Patrick Galili, Cannes (FR); Laurent Capella, Vence (FR)

(73) Assignee: NXP, B.V., Eindhoven (NL)

( * ) Notice: Subject to any disclaimer, the term of this patent is extended or adjusted under 35 U.S.C. 154(b) by 2571 days.

(21) Appl. No.: 11/597,044

(22) PCT Filed: May 17, 2005

(86) PCT No.: PCT/IB2005/051593
§ 371 (c)(1),
(2), (4) Date: Nov. 16, 2006

(87) PCT Pub. No.: WO2005/112273
PCT Pub. Date: Nov. 24, 2005

(65) Prior Publication Data
US 2007/0242781 A1      Oct. 18, 2007

(30) Foreign Application Priority Data

May 18, 2004    (EP) .................................... 04300290

(51) Int. Cl.
*H04B 1/66*    (2006.01)
*H03M 13/27*   (2006.01)
*H03M 13/29*   (2006.01)
*H03M 13/00*   (2006.01)

(52) U.S. Cl.
CPC ...... *H03M 13/2764* (2013.01); *H03M 13/2957* (2013.01); *H03M 13/6519* (2013.01)

(58) Field of Classification Search
USPC ........................................................ 375/341
See application file for complete search history.

(56) References Cited

U.S. PATENT DOCUMENTS

| 5,574,751 | A  | * | 11/1996 | Trelewicz | 375/265 |
| 5,621,764 | A  | * | 4/1997  | Ushirokawa et al. | 375/317 |
| 6,128,707 | A  | * | 10/2000 | Arimilli et al. | 711/143 |
| 6,192,084 | B1 | * | 2/2001  | Miyauchi et al. | 375/262 |
| 6,285,789 | B1 | * | 9/2001  | Kim | 382/233 |
| 6,307,901 | B1 | * | 10/2001 | Yu et al. | 375/341 |

(Continued)

FOREIGN PATENT DOCUMENTS

DE          10214393 A1    2/2003

OTHER PUBLICATIONS

Berens F et al: "Implementation Aspects of Turbo-Decoders for Future Radio Applications"; Vehicular Tech. Conf. 1999 Fall; IEEE VTS 50th Amsterdam Netherlands Sep. 19-22, 1999; USA; vol. 5, Sep. 19, 1999 pp. 2601-2605.

(Continued)

*Primary Examiner* — Santiago Garcia

(57) ABSTRACT

A receiver is disclosed, wherein a re-ordering means comprises a multiplexer, a finite-state machine, and a plurality of buffers. the finite-state machine is arranged to control the multiplexer to load the buffers from a bus such that the output of the buffers is directly decodable by the decoder. A receiving method is also disclosed, comprising the steps of: determining a transmission mode and a bus configuration; entering an initializing state of branching of a finite-state machine according to said determined transmission mode and bus configuration; performing transitions between state of the said finite-state machine for each received set of soft data provided on a bus; multiplexing said soft data to a plurality of buffers in dependence on the state of said finite-state machine; and writing said multiplexed data into said plurality of buffers.

13 Claims, 8 Drawing Sheets

(56) References Cited

U.S. PATENT DOCUMENTS

| | | | |
|---|---|---|---|
| 6,392,572 B1 | 5/2002 | Shiu et al. | |
| 6,393,076 B1 * | 5/2002 | Dinc et al. | 375/341 |
| 6,445,755 B1 * | 9/2002 | Chung et al. | 375/341 |
| 6,452,979 B1 * | 9/2002 | Ariel et al. | 375/265 |
| 6,484,283 B2 * | 11/2002 | Stephen et al. | 714/786 |
| 6,499,128 B1 * | 12/2002 | Gerlach et al. | 714/755 |
| 6,516,437 B1 * | 2/2003 | Van Stralen et al. | 714/755 |
| 6,526,539 B1 * | 2/2003 | Yano et al. | 714/794 |
| 6,799,295 B2 * | 9/2004 | Nguyen | 714/794 |
| 6,807,239 B2 * | 10/2004 | Sugimoto et al. | 375/341 |
| 6,813,742 B2 * | 11/2004 | Nguyen | 714/794 |
| 6,829,313 B1 * | 12/2004 | Xu | 375/341 |
| 6,856,657 B1 * | 2/2005 | Classon et al. | 375/341 |
| 6,865,098 B1 * | 3/2005 | Ichiriu et al. | 365/49.15 |
| 6,901,117 B1 * | 5/2005 | Classon et al. | 375/341 |
| 6,901,119 B2 * | 5/2005 | Cideciyan et al. | 375/341 |
| 6,940,928 B2 * | 9/2005 | Cameron | 375/341 |
| 6,950,476 B2 * | 9/2005 | Tarrab et al. | 375/265 |
| 6,996,767 B2 * | 2/2006 | Chang et al. | 714/786 |
| 7,027,533 B2 * | 4/2006 | Abe et al. | 375/341 |
| 7,031,406 B1 * | 4/2006 | Li et al. | 375/341 |
| 7,035,342 B2 * | 4/2006 | Cameron et al. | 375/265 |
| 7,058,878 B2 * | 6/2006 | Kanaoka et al. | 714/794 |
| 7,065,695 B2 * | 6/2006 | Cameron et al. | 714/755 |
| 7,107,509 B2 * | 9/2006 | Bickerstaff et al. | 714/780 |
| 7,143,335 B2 * | 11/2006 | Choi | 714/795 |
| 7,149,951 B2 * | 12/2006 | Seo | 714/786 |
| 7,158,589 B2 * | 1/2007 | Cameron et al. | 375/341 |
| 7,159,169 B2 * | 1/2007 | Honary et al. | 714/795 |
| 7,218,690 B2 * | 5/2007 | Learned | 375/341 |
| 7,236,546 B2 * | 6/2007 | Egnor et al. | 375/341 |
| 7,242,726 B2 * | 7/2007 | Cameron et al. | 375/295 |
| 7,269,777 B2 * | 9/2007 | Becker et al. | 714/755 |
| 7,272,771 B2 * | 9/2007 | Nieminen | 714/755 |
| 7,281,198 B2 * | 10/2007 | Yagihashi | 714/794 |
| 7,340,013 B2 * | 3/2008 | Ammer et al. | 375/340 |
| 7,434,145 B2 * | 10/2008 | Jin et al. | 714/780 |
| 7,460,608 B2 * | 12/2008 | Cameron et al. | 375/265 |
| 7,499,503 B2 * | 3/2009 | Cameron et al. | 375/298 |
| 7,525,944 B2 * | 4/2009 | Vayanos et al. | 370/342 |
| 7,646,742 B2 * | 1/2010 | Petrovic et al. | 370/328 |
| 2002/0124227 A1 | 9/2002 | Nguyen | |
| 2003/0039323 A1 * | 2/2003 | Choi | 375/341 |
| 2003/0115539 A1 | 6/2003 | Giese et al. | |
| 2003/0147348 A1 * | 8/2003 | Jiang | 370/229 |
| 2004/0044946 A1 * | 3/2004 | Bickerstaff et al. | 714/792 |
| 2004/0153942 A1 * | 8/2004 | Shtutman et al. | 714/755 |
| 2004/0199858 A1 * | 10/2004 | Becker et al. | 714/795 |
| 2004/0268096 A1 * | 12/2004 | Master et al. | 712/227 |
| 2005/0060469 A1 * | 3/2005 | Feng et al. | 710/305 |
| 2005/0180312 A1 * | 8/2005 | Walton et al. | 370/208 |
| 2006/0107181 A1 * | 5/2006 | Dave et al. | 714/758 |
| 2007/0042782 A1 * | 2/2007 | Lee et al. | 455/450 |
| 2007/0136640 A1 * | 6/2007 | Jarrar | 714/763 |
| 2009/0094505 A1 * | 4/2009 | Nguyen | 714/780 |
| 2010/0002100 A1 * | 1/2010 | Master et al. | 348/231.99 |

OTHER PUBLICATIONS

Alsolaim, Ahmad M.; "Dynamically Reconfigurable Architecture for Third Generation Mobile Systems"; Dissertation—Ohio University; 62 pages (2002).

Shin, Myoung-Cheol, et al; "A Programmable Turbo Decoder for Multiple 3G Wireless Standards"; IEEE International Conference Solid-State Circuits 2003 — Digest of Technical Papers; 10 pages (2003).

* cited by examiner

TURBO DECODER INPUT REORDERING

FIELD OF INVENTION

The present invention relates to a receiver and a receiving method.

BACKGROUND OF INVENTION

Cellular telephony has become a widely available mode of communication in modern society. Within the field of wireless telecommunications systems, there are a plurality of systems referred to as Code Division Multiple Access systems, otherwise known as CDMA. Examples are Wideband CDMA standards (WCDMA), comprising the sub-systems Time Division Duplex (TDD) and Frequency Division Duplex (FDD), Time Division Synchronous CDMA (TD-SCDMA)) and CDMA2000. These are commonly called modes of communication or transmission modes. Within the Code Division Multiple Access system, a user of a mobile station (e. g. handset) is able to communicate with a user of another telecommunication device by way of a base station. A mobile station and a base station of the Code Division Multiple Access system communicate via a wireless digital radio interface. The specifications of the wireless digital radio interfaces vary slightly in a plurality of different aspects. Further, within each specific radio interface, a plurality of transmission throughput characteristics may be available.

All of the above mentioned modes of communication systems use a turbo coding scheme, i.e. an iterative coding scheme. A turbo encoder at a transmitter comprises a first and a second recursive systematic coder (RSC) and an interleaver, which feeds the second RSC with interleaved data in order to increase the overall transmission robustness to noise. A turbo decoder at a receiver receives 2 to 5 soft data in dependence on the transmission mode and rate, and estimates the data in an iterative decoding process. The turbo decoder invokes a process which reverses the transformation performed by the encoder, and comprises two soft input—soft output (SISO) decoders that work cooperatively. Each SISO decoder produces a posteriori information which is used as a priori information by the other SISO decoder.

There is a need for a flexible solution that can deal with the different communication modes. At the same time, there is a need for a high-performance solution that is required for each of the above mentioned communication modes. In F. Berens, A. Worm, H. Michel, and N. Wehn, "Implementation Aspects of Turbo-Decoders for Future Radio Applications," Proceedings of the IEEE Vehicular Technology Conference (VTC) Fall 1999, pp. 2601-2605, Amsterdam, September 1999 it is pointed out that a pure software implementation of a turbo decoder is below the requirements of high-rate data services, but gives high flexibility. On the other hand, hardware lacks flexibility, but gives superior performance. Therefore, a mixed hardware/software implementation is suggested in Berens et al. for combining the flexibility of a software solution and superior performance of a dedicated hardware implementation.

Still, there are a few problems to solve. The turbo decoder requires a complete block of soft input data to be able to perform the above described process, since the interleaver has to be able to access any data in this block. Therefore, a complete block has to be buffered before decoding processing of the block. The data need to be stored in respect of how the decoder core expects to read data from the buffer to be able to use the superior performance of a hardware implemented turbo decoder. A conventional solution, as used in any of the above mentioned transmission modes separately, relies on the system to reorder data. FIG. 1 shows a set-up of a conventional receiver 100 comprising a radio receiver 102, a sampler 104, and a decoder 106. The receiver is connected to a system bus 112, to which a memory 108 and a system controller 110 also are connected. The radio receiver comprises one or more antennas 114 and electronics (not shown) for processing radio-frequency signals received by the antennas 114. The radio receiver 102 outputs a demodulated signal corresponding to the received radio-frequency signal. The sampler 104 samples the demodulated signal to produce soft data, that is, a digital representation of the received information plus interference with more bits than needed for only representing the received information. The soft data is stored in the memory 108 under supervision of the system controller 110. The data is then reordered by the system controller 110. The data reordering is conventionally performed by software, and consumes a lot of system resources. The reordered data are then fed to a hardware implemented decoder buffer, e.g. the shared memory 108.

One drawback of this conventional structure is that reordering of soft samples in software consumes CPU power. Another drawback is that the system bus is not efficiently used in view of bandwidth. It is therefore a problem that reordering of soft samples consumes a large amount of system resources.

SUMMARY OF THE INVENTION

It is therefore an object of the present invention to provide a more efficient reordering.

The above object is obtained according to a first aspect of the present invention by a receiver comprising a radio interface, a sampler, a decoder, and a bus connected to the sampler and decoder. The sampler is configured to generate soft data based on signals received by the radio interface. The decoder is configured to receive the soft data from the sampler. The decoder comprises a re-ordering means and a decoder, wherein the re-ordering means comprises a multiplexer, a finite-state machine, and a plurality of buffers. The finite-state machine is arranged to control the multiplexer to load the buffers from the bus such that the output of the buffers is decodable by the decoder.

Advantages of this are fast and flexible reordering of soft data prior to decoding. This is achieved by the flexible hardware implementable solution where a finite-state machine and a multiplexer reorder and write soft data into a plurality of buffers. Thus the soft data is directly decodable by the decoder.

The receiver may further comprise a configuration register configured to hold information indicating bus configuration, transmission mode and rate. An advantage of this is provision of control information for the finite-state machine in a low-complexity and fast way.

The receiver may further comprise an address and control generator controlled by the finite-state machine and arranged to control writing of soft data into the buffers. An advantage of this is improved writing control of the buffers.

The plurality of buffers may comprise five buffers, each arranged to be loaded with a plurality of soft data simultaneously. This enables any bus configuration to be used together with any transmission mode and rate. An advantage of this is improved utilization of the bus.

The decoder may comprise a turbo decoder. The decoder may further comprise a Viterbi decoder.

The plurality of buffers may each comprise two banks of independent two-port memories. Alternatively, the plurality of buffers may each comprise four banks of independent single-port memories. This will enable simultaneous writing of soft data associated with a plurality of addresses into the buffers. An advantage of this is faster and more flexible filling of the buffers.

The above object is obtained according to a second aspect of the present invention by a receiving method comprising the steps of: receiving and demodulating a radio signal; generating soft data by sampling the demodulated radio signal; transmitting the soft data on a bus to a decoder; reordering and buffering the soft data by: determining a transmission mode and a bus configuration; entering a initializing state of branching of a finite-state machine according to the determined transmission mode and bus configuration; performing transitions between states of the finite-state machine for each received set of soft data provided on a bus; multiplexing the soft data to a plurality of buffers in dependence on the state of the finite-state machine; and writing the multiplexed data into the plurality of buffers; outputting the buffered soft data from the plurality of buffers to a turbo decoder; and decoding the soft data by the turbodecoder.

The features and advantages of the second aspect of the invention are essentially the same as of the first aspect of the present invention.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings, wherein.

DETAILED DESCRIPTION OF A PREFERRED EMBODIMENT

Figure 1:
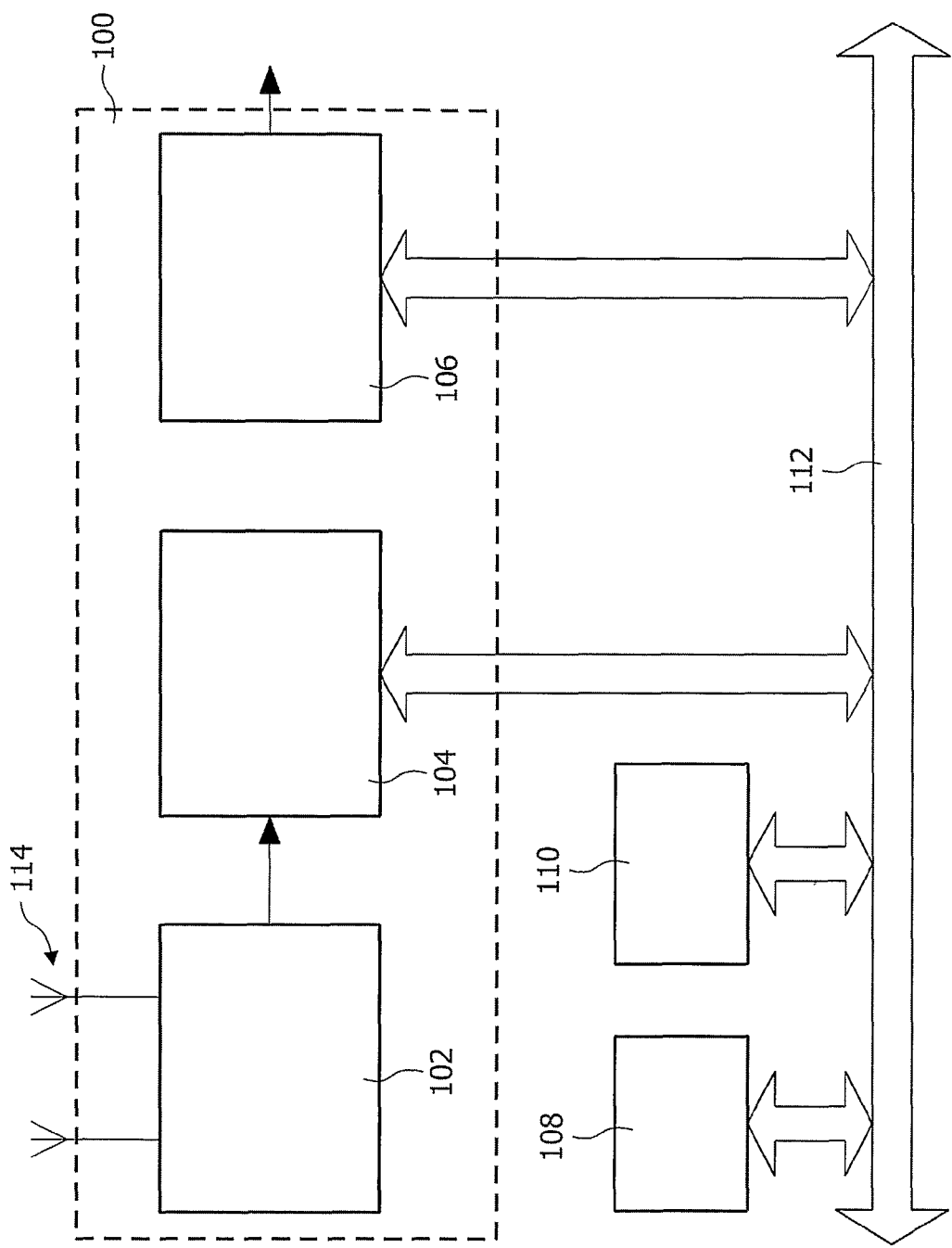
FIG. 1 shows a set-up according to a conventional receiver.
Figure 2:
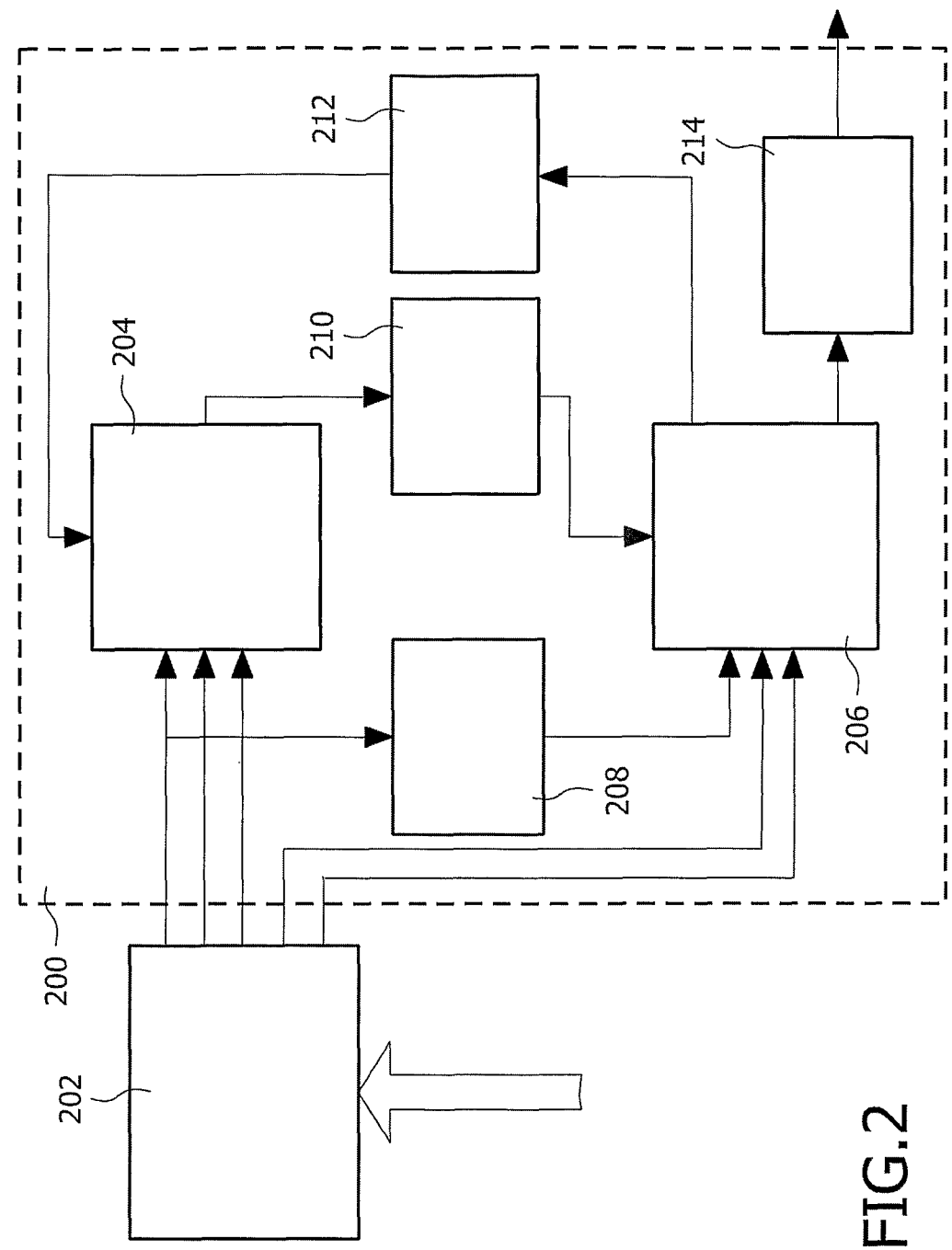
FIG. 2 shows a conventional turbo decoder.

FIG. 2 shows a conventional turbo decoder, comprising a turbo decoder core 200 and an input buffer 202. The input buffer 202 routes buffered soft data to a first soft-in soft-out (SISO) decoder 204 and a second SISO decoder 206. Some of the data routed to the first SISO decoder 204 is interleaved by a first interleaver 208, and routed to the second SISO decoder 206. Each SISO decoder 204, 206 produces a posteriori information which is used as a priori information by the other SISO decoder 204, 206. That is, the a posteriori information from the first SISO decoder 204 is interleaved by a second interleaver 210, and is fed to the second SISO decoder 206. The a posteriori information from the second SISO decoder is de-interleaved by a first de-interleaver 212, and is fed to the first SISO decoder. The second SISO decoder generates a probability factor Λ that indicates which signal was probably transmitted. Λ is de-interleaved by a second de-interleaver 214, and output for further processing.

In the turbo decoder arrangement in FIG. 2, the buffered soft data are assumed to be in the right order in the input buffer 202. The present invention provides reordering of soft data, which will be described below, such that a conventional turbo decoder core can be used.

Figure 3:
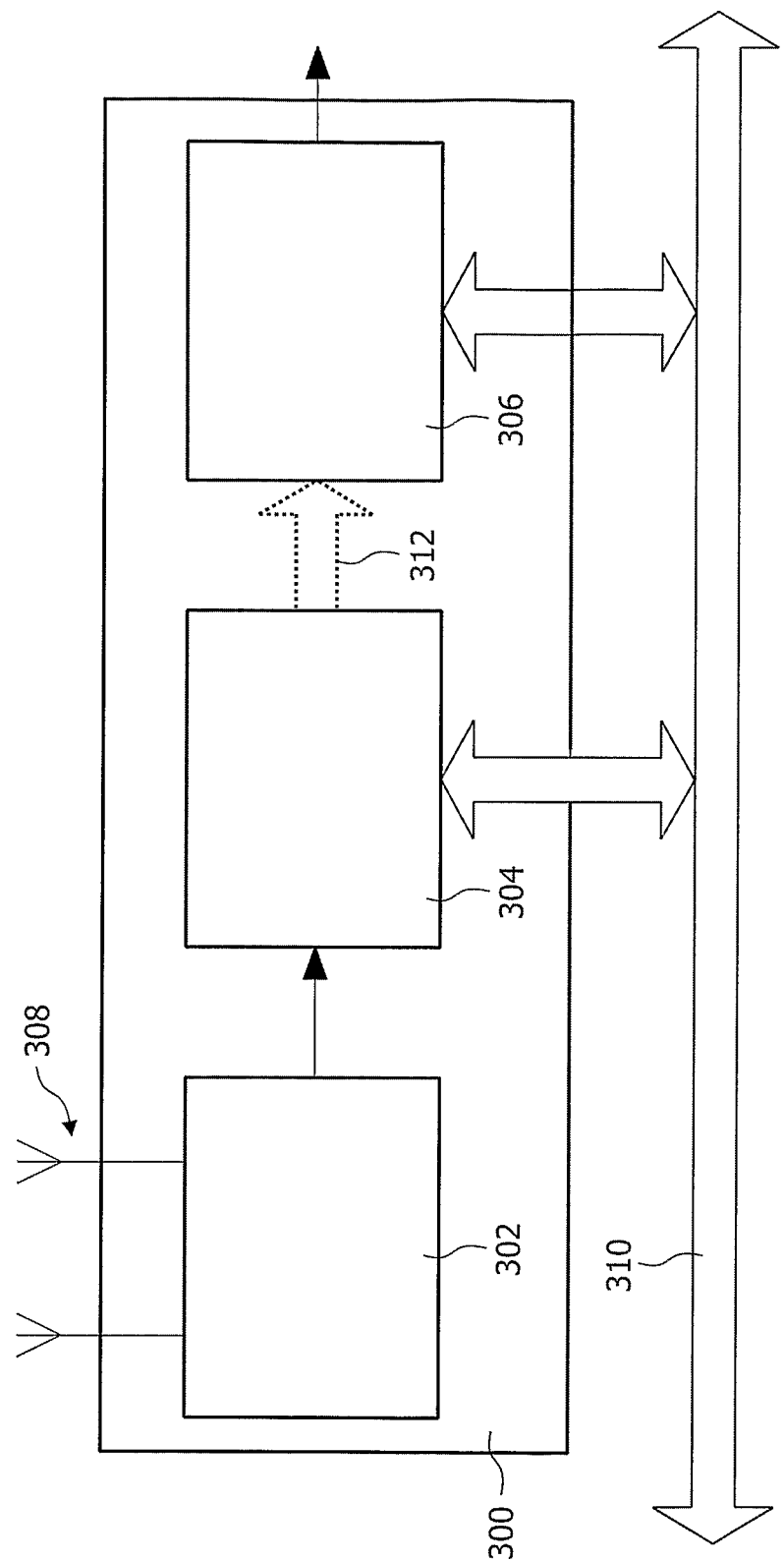
FIG. 3 shows a set-up according to an embodiment of the present invention.

FIG. 3 shows a set-up according to an embodiment of the present invention. A receiver 300 comprises a radio receiver 302, a sampler 304, and a decoder 306. The radio receiver 302 receives radio-frequency signals through one or more antennas 308 and comprises electronics (not shown) adapted for demodulating the radio-frequency signals. Preferably, the radio receiver is adapted to receive signals within a plurality of frequency bands to be able to work in a plurality of transmission modes, such as WCDMA (TDD and FDD), TD-SCDMA and CDMA2000. The demodulated signal is sampled by a sampler 304, which produces soft data, that is, a digital representation of the received information plus interference with more bits than needed for only representing the received information. The soft data is fed to a turbo decoder 306, preferably through a system bus 310. Functionally, it can be regarded as the soft data is fed directly to the turbo decoder 306, as depicted by dashed arrow 312. The turbo decoder 306 outputs a decoded signal, which is to be further processed by other parts of the receiver.

The different transmission modes and rates provide different sets of soft values. WCDMA provides a set of {R1, R1P1, R2P1} for all addresses. CDMA2000 and rate ½ provides a set of {R1, R1P1} for even addresses and {R1, R2P1} for odd addresses. CDMA2000 and rate ⅓ provides {R1, R1P1, R2P1} for all addresses. CDMA and rate ¼ provides {R1, R1P1, R1P2, R2P2} for even addresses and {R1, R1P1, R2P1, R2P2} for odd addresses. CDMA2000 and rate ⅕ provides {R1, R1P1, R1P2, R2P1, R2P2} for all addresses. This is given by the encoding scheme at a transmitter.

Figure 4:
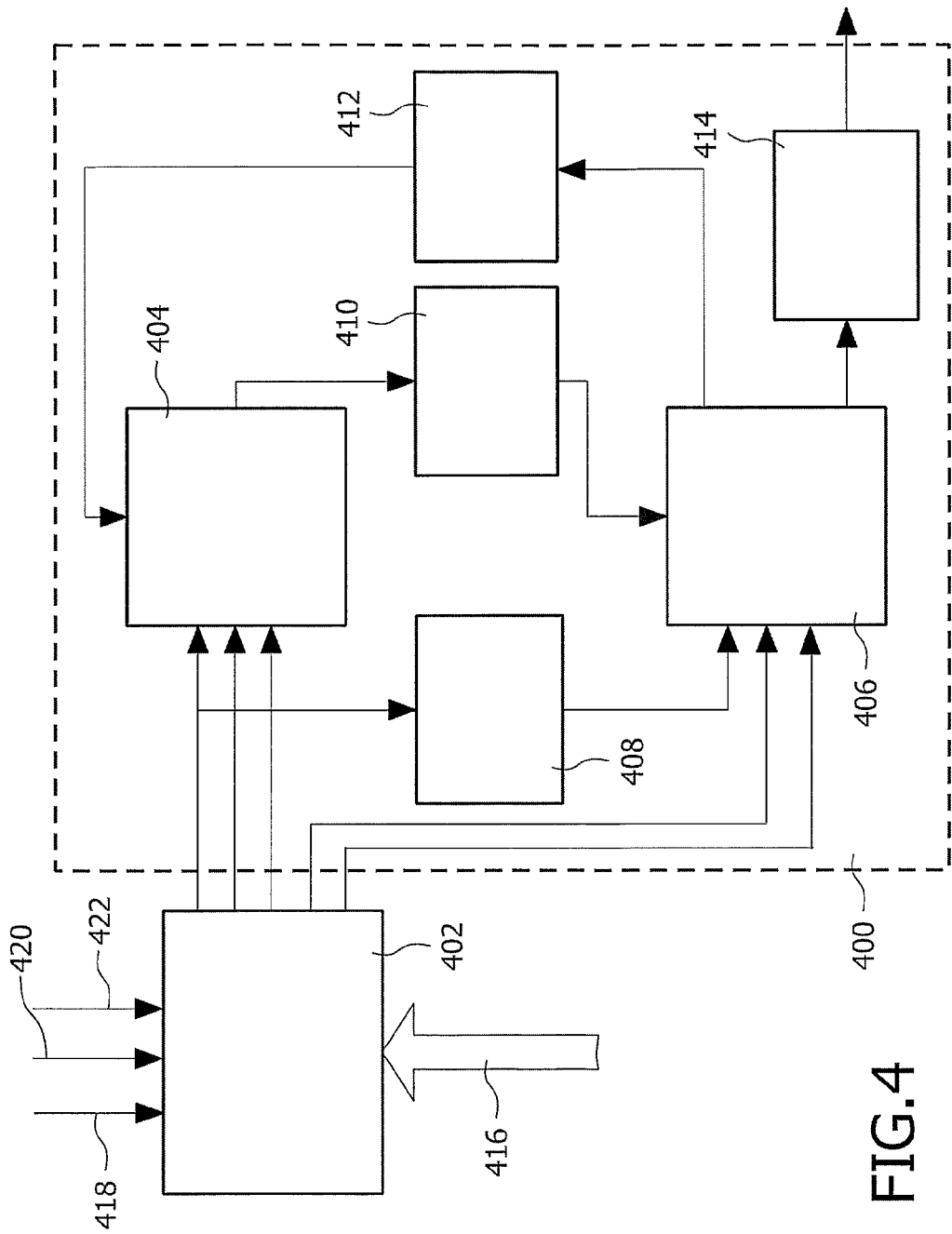
FIG. 4 shows a turbo decoder according to an embodiment of the present invention.

FIG. 4 shows a turbo decoder according to an embodiment of the present invention. The turbo decoder comprises a turbo decoder core 400 and an input buffer 402. The turbo decoder core 400 comprises a first soft-in soft-out (SISO) decoder 404 and a second SISO decoder 406. Some of the data routed to the first SISO decoder 404 is interleaved by a first interleaver 408, and routed to the second SISO decoder 406. Each SISO decoder 404, 406 produces a posteriori information which is used as a priori information by the other SISO decoder 404, 406. That is, the a posteriori information from the first SISO decoder 404 is interleaved by a second interleaver 410, and is fed to the second SISO decoder 406. The a posteriori information from the second SISO decoder 406 is de-interleaved by a first de-interleaver 412, and is fed to the first SISO decoder 404. The second SISO decoder generates a probability factor Λ that indicates which signal probably was transmitted. Λ is de-interleaved by a second de-interleaver 414, and output for further processing.

Soft data 416 is transported to the input buffer 402 from the system bus or directly from the sampler. The input buffer 402 performs both reordering data and buffering data. To be able to do this, a plurality of control signals 418, 420, 422 is provided. A first control signal 418 applies information about transmission mode, transmission rate, and input configuration to the input buffer 402. A second control signal 420 applies information about write address and write control to the input buffer 402. A third control signal 422 applies information about read address and read control to the input buffer 402. The function of the control signals and how these are used will be described below.

Figure 5:
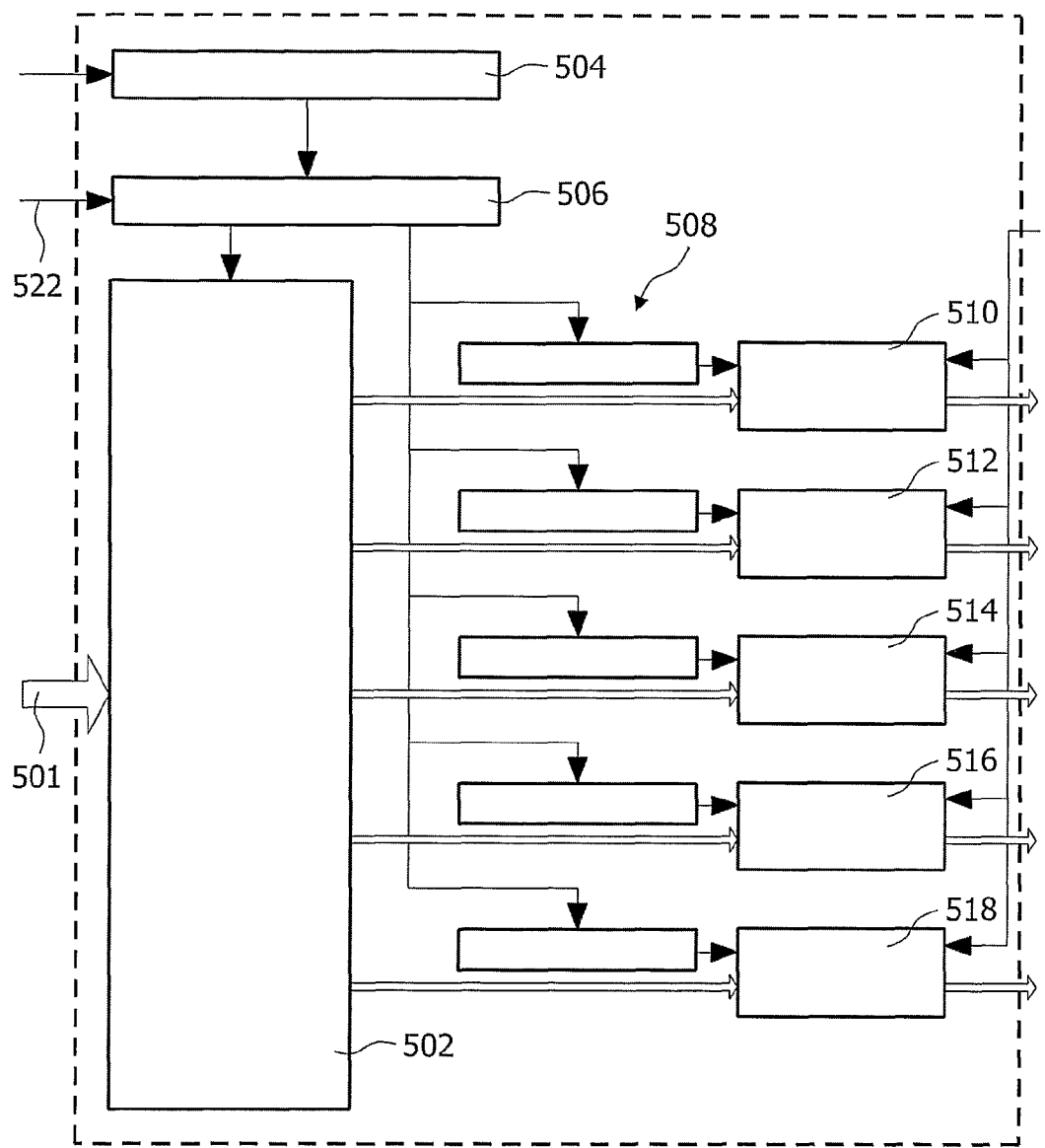
FIG. 5 shows a buffer arrangement according to an embodiment of the present invention.
Figures 8, 9:
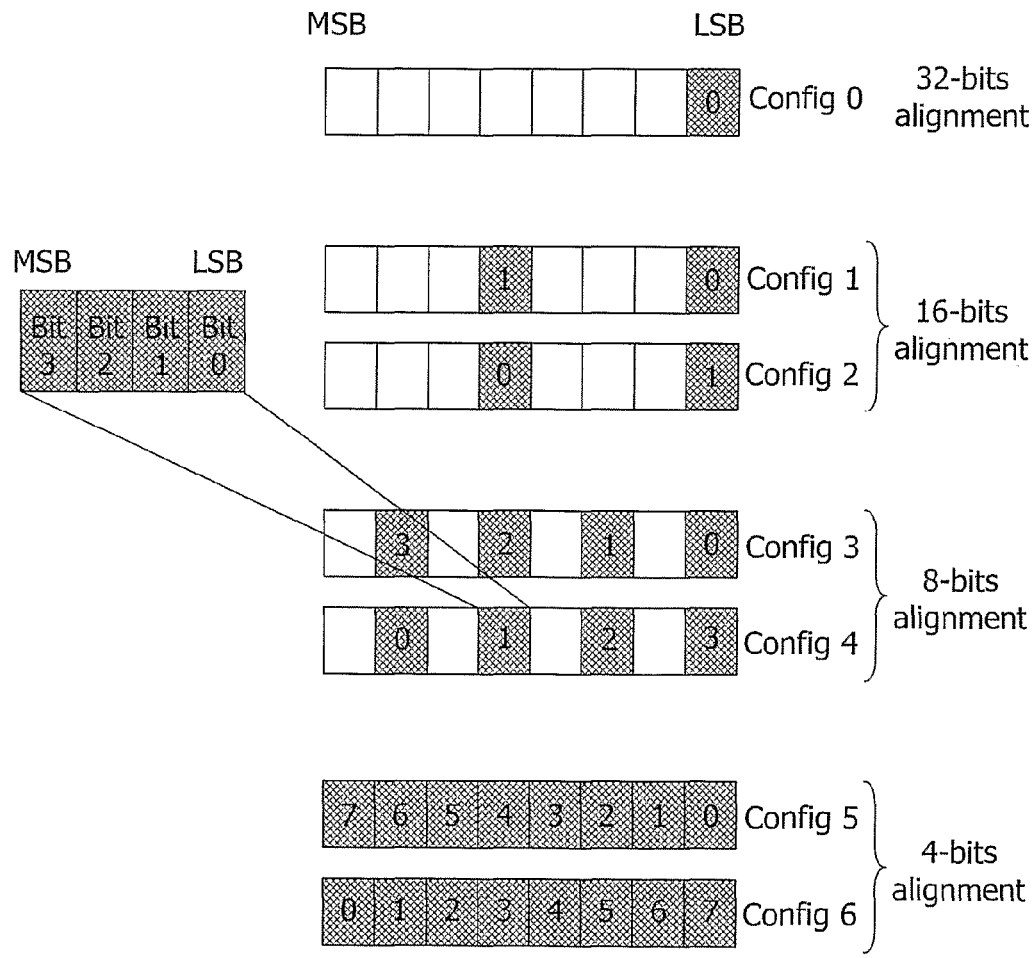
FIG. 8 shows a table according to the present invention.
FIG. 9 shows a bias configuration according to the present invention.

FIG. 5 shows an input buffer 500 according to an embodiment of the present invention. The input buffer 500 is arranged to reorder incoming soft data from a bus 501. FIG. 9 shows examples of possible bus configurations when a 32-bit bus carries 4-bit soft data. Different configurations of filling the bus depend on the transmission mode. For example, it may be 4, 8, 16, or 32 bits of soft data aligned on a 32-bit bus, and any direction of indexing the data is possible. This may be, for example on a 32-bit data bus, xxxxxxxx, 0x0x0x0x, 000x000x, 0000000x where x would be a 4-bit soft data and 0 would be 4bits of unused data. These soft data can be switched, adding further flexibility to the system software. For a 64 or 128-bit data bus, or any width of the bus, and any size of the soft data, e.g. 6 or 8 bits, the data alignment can be made in a similar way.

Returning to FIG. 5, the input buffer comprises a multiplexer 502, a configuration register 504, a finite-state machine 506, a plurality of address and control generators 508, and a plurality of buffers 510, 512, 514, 516, 518.

Within each soft input, the bits are supposed to be in the same order independent of the direction of indexing. For handling different bus configurations and transmission modes and rates, the configuration register 504 is programmed. Thus, in dependence on the standard, it is determined if the transmission mode is WCDMA and CDMA2000, if the rate is ½, ⅓, ¼ and ⅕, and which of several data bus input configurations is present.

The finite-state machine 506 controls the multiplexer 502 and the address and control generators 508. The finite-state machine 506 is provided with a write address and control signal 522 from the system controller during the filling of the input buffer. The finite-state machine also gets an information signal from the configuration register 504. In dependence on these signals, the finite-state machine 506 controls the multiplexer 502 as described below.

State transitions of the finite-state machine 506 occur synchronously to a bus clock when writing to the turbo decoder is performed. An example of a procedure for a transmission mode and rate is depicted in FIG. 6.

Figure 6:
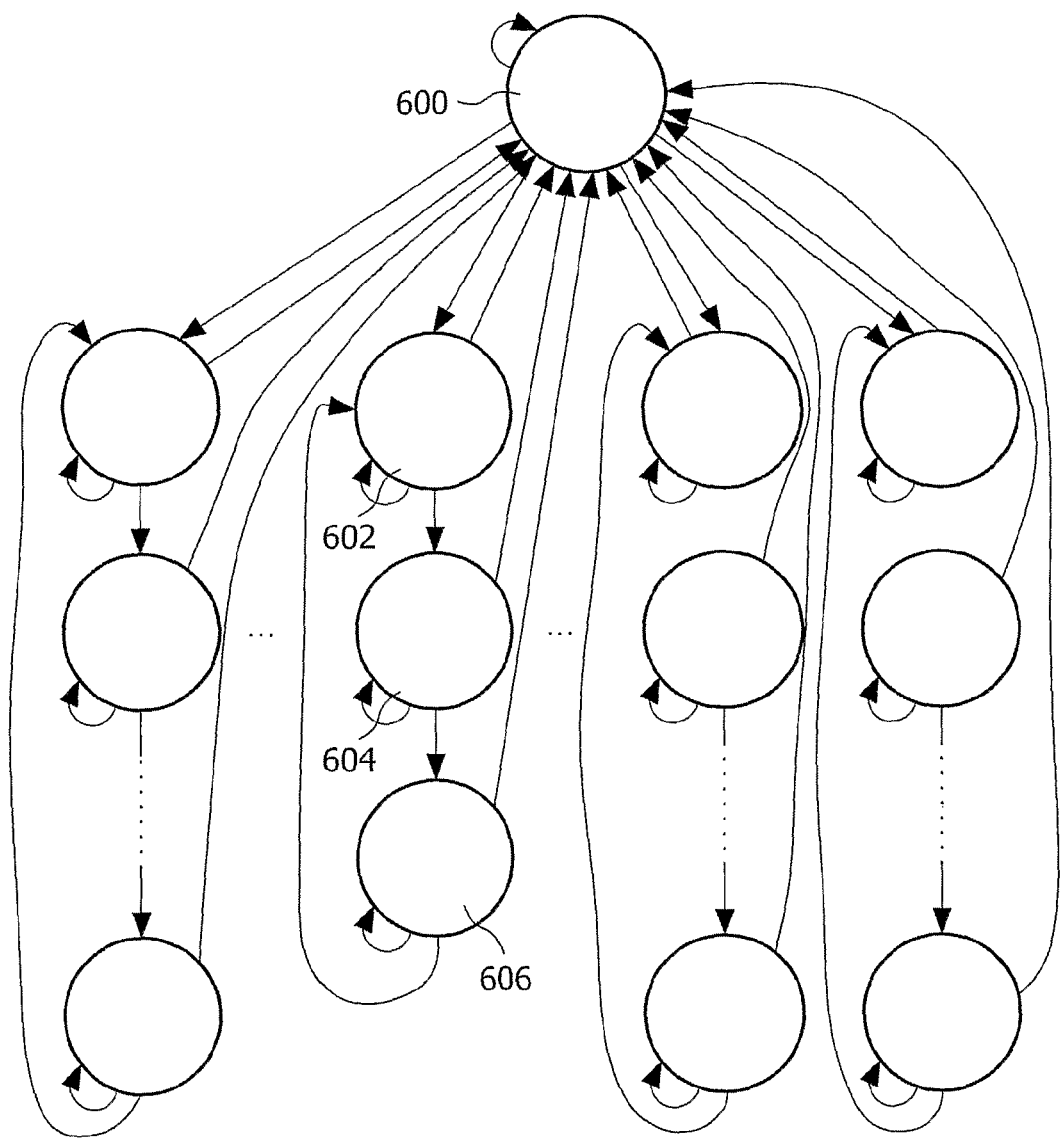
FIG. 6 shows an example of a procedure used in the present invention.

In FIG. 6 the example is determined that the bus configuration is configuration 6, i.e. 4-bit aligned. It is also determined that the transmission mode is CDMA2000 and the transmission rate is ⅓. The finite-state machine then enters a branch according to the conditions determined by a transition from an idle_state 600 to an r3_c6_init_state 602, when the configuration registers have been set. Each time a writing to an input memory area is performed, the finite-state machine enters its next state, e.g from r3_c6_init_state 602 to r3_c6_1_state 604, from r3_c6_1_state 604 to r3_c6_2_state 606 or r3_c6_2_state 606 to r3_c6_init_state 602. For another transmission mode, transmission rate or input configuration, transition from idle_state 600 to any of the other branches of states, and corresponding transitions between the states of that branch of states are performed. When a write strobe is frozen, the finite-state machine stays in its current state. The write strobe comes from the system bus with address and data. When the block is buffered, the state machine returns to the idle_state 600. For each state, a specific multiplexing scheme of the soft data is applied to the multiplexer. At the same time, the signals for the address and control generators are generated simultaneously with the multiplexing scheme from the finite-state machine outputs. This means that, in each state, each of the individual address incrementers are set (or not set), and each of the effective write enable signals are set (or not set). That is, there is an address and a write enable signal for each of the plurality of memory ports to allow independent filling of the turbo decoder input buffers.

Figure 7:
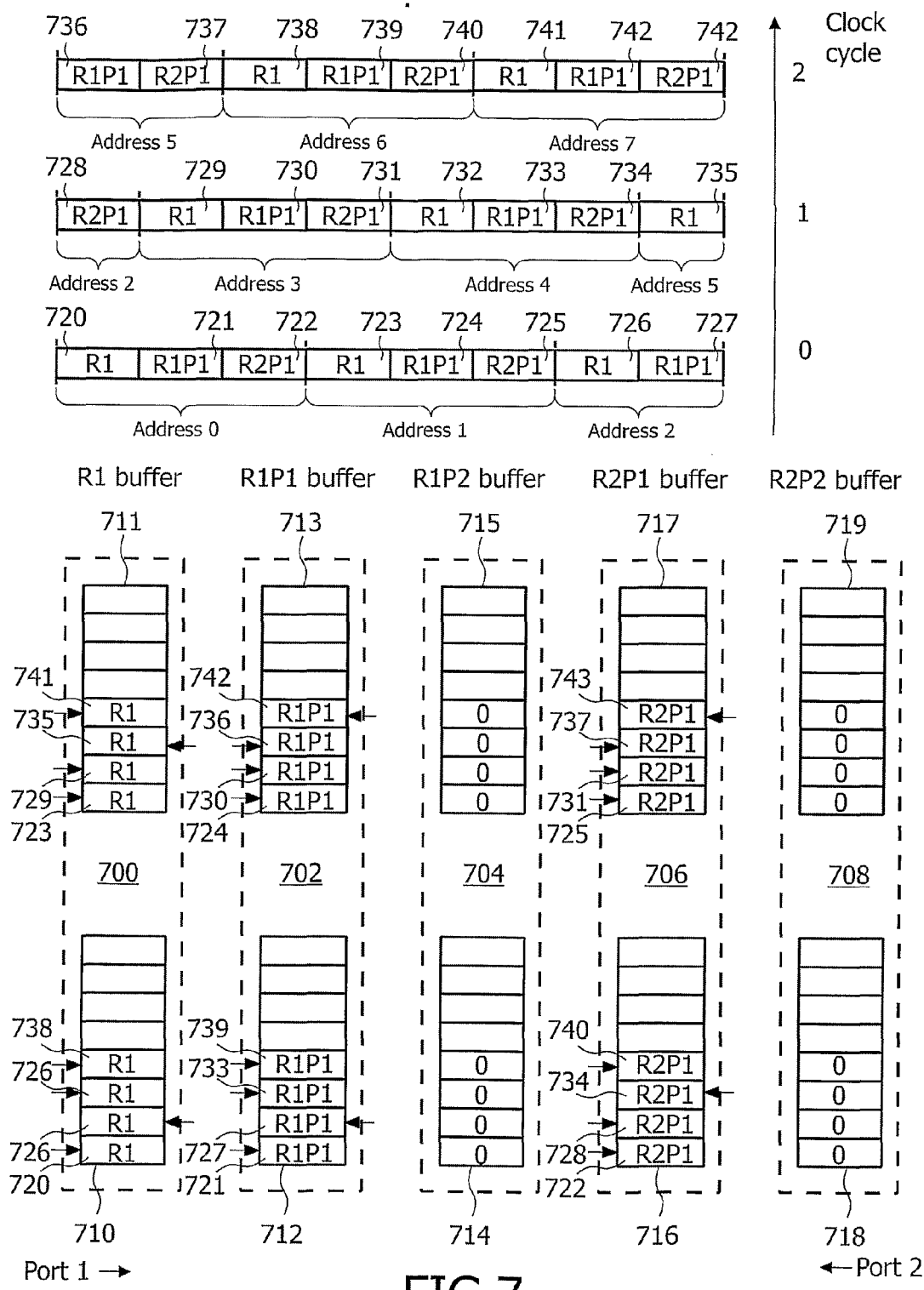
FIG. 7 shows the buffers according to the present invention.

FIG. 7 illustrates filling of buffers 700, 702, 704, 706, 708. To be able to write four addresses simultaneously, which is considered to be the maximum when a 32-bit bus is used and four-bit (nibble) soft values are provided, double-port memories 710, 711, 712, 713, 714, 715, 716, 717, 718, 719 grouped in two banks are used, where memories 710, 712, 714, 716, 718 form one bank and are used for even addresses, and memories 711, 713, 715, 717, 719 form the other bank and are used for odd addresses. Of course, other configurations are possible, e.g. four banks of single-port memories, or any configuration that enables simultaneous writing of as many addresses that can be present on an actual bus. However, for explanatory, but not limiting, purposes, here a 32-bit bus delivers 4 bit—aligned soft values related to CDMA2000, rate ⅓, i.e. R1, R1P1, and R2P1 buffers are used for all addresses, on bus configuration 6, i.e. 4-bit alignment.

During a first clock pulse (clock cycle 0), eight nibbles 720, 721, 722, 723, 724, 725, 726, 727 are provided on the bus. Since the transmission mode is WCDMA, only R1, R1P1, and R2P1 are provided for each address, i.e. each address occupies three nibbles. Consider the first three nibbles 720, 721, 722 comprising R1, R1P1, and R2P1 associated to address 0. Therefore, they are loaded into the memory bank comprising memories 710, 712, 714, 716, 718 for even addresses. Memories 714 and 718 are not used during this configuration, and are loaded with nil values. The memories 710, 712, 716 are loaded with the nibbles associated with address 0, i.e. in the first positions of the R1, R1P1, and R2P1 buffers 700, 702, 706, respectively. Assume that they are all loaded through port 1, here denoted by a right arrow, of the memories 710, 712, 716. Simultaneously, the following three nibbles 723, 724, 725, i.e. associated to address 1, are loaded into the memories 711, 713, 717 of the memory bank for odd addresses, and also simultaneously, the remaining two nibbles 726, 727, i.e. associated with address 2, are loaded into the memories 710, 712 of the memory bank for even addresses.

However, port 1 of the memories 710, 712, 716 of the even address memory bank is occupied by nibbles 720, 721, 722 associated to address 0. Therefore, nibbles 726, 727 associated with address 2 will use port 2, here denoted by a left arrow, to be written into the even address memory bank. A write strobe is used to write the nibbles 726, 727 at the correct position of the memories 710, 712, i.e. incremented one step. At the next clock cycle (clock cycle 1), the first nibble 728 is associated with address 2, and is therefore loaded into memory 716 of the memory bank for even addresses, on port 1. The next three nibbles 729, 730, 731 are associated with address 3, and are loaded into memories 711, 713, 717 of the memory bank for odd addresses on port 1. The three subsequent nibbles 732, 733, 734 are associated with address 4, and are loaded into memories 710, 712, 714 of the memory bank for even addresses. Note that port 1 of the memory 716, i.e. the R2P1 buffer for even addresses, is occupied by writing nibble 728 associated with address 2. Therefore, nibble 734 associated with address 4 is written through port 2, here denoted by left arrow. The last nibble 735 of this clock cycle is associated with address 5, and is written through port 2 of the memory 711 for odd addresses, since port 1 is occupied by writing the nibble 729 associated with address 3. This procedure is repeated in a similar way during clock cycle 2, where the rest of the nibbles 736, 737 associated with address 5, and nibbles 738, 739, 740, 741, 742, 743 associated with addresses 6 and 7 are loaded into the buffers 700, 702, 706. Note that the procedure can now start all over again, since this case requires 3 cycles to evenly fill the buffers.

FIG. 8 shows a table of the required number of clock cycles for different transmission modes and bus configurations, and FIG. 9 shows the bus configurations referred to in FIG. 8. The number of states of the branches of the finite-state machine is thus chosen accordingly.

The procedure described above is performed during three clock cycles, i.e. during the three states 602, 604 and 606 of the state machine of FIG. 6. Thus, the buffers are loaded by the soft data from the bus such that the buffers can be accessed by the decoder, which receives the soft data in a correctly re-ordered manner.

Returning to FIG. 5, soft data 501 from a system bus, or directly from a sampler, is fed to the multiplexer 502. Depending on the multiplexing scheme provided by the finite-state machine 506, the multiplexer 502 applies data to the plurality of input buffers 510, 512, 514, 516, 518 as described above, such that a proper reordering is performed.

The invention claimed is:

1. A receiver comprising
a radio interface,
a sampler,
a decoder, and
a bus connected to said sampler and decoder,
wherein said sampler is configured to generate soft data based on signals received by said radio interface,
said decoder is configured to receive said soft data from said sampler, and said decoder comprises
an input buffer for re-ordering said soft data, and
a decoder core,
wherein said input buffer comprises a multiplexer, a finite-state machine, and a plurality of buffers,
wherein said finite-state machine is arranged to control said multiplexer to load said buffers from said bus such that the output of said buffers is decodable by said decoder core.

2. Receiver according to claim 1, wherein said input buffer further comprises a configuration register configured to hold information indicating bus configuration, transmission mode and rate for a plurality of transmission modes.

3. Receiver according to claim 1, wherein said input buffer further comprises a plurality of address and control generators controlled by said finite-state machine and arranged to control writing of soft data into said buffers.

4. Receiver according to claim 1, wherein said plurality of buffers comprises five buffers, each arranged to be loaded with a plurality of soft data simultaneously.

5. Receiver according to claim 1, wherein said decoder comprises a turbo decoder.

6. Receiver according to claim 5, wherein said decoder further comprises a Viterbi decoder.

7. Receiver according to claim 1, wherein said plurality of buffers each comprises two banks of independent two-port memories.

8. Receiver according to claim 1, wherein said plurality of buffers each comprise four banks of independent single-port memories.

9. A receiving method comprising the steps of:
receiving and demodulating a radio signal;
generating soft data by sampling said demodulated radio signal;
transmitting said soft data on a bus to a decoder;
reordering and buffering said soft data within an input buffer of said decoder by:
determining a transmission mode and a bus configuration;
entering an initializing state of branching of a finite-state machine within said input buffer according to said determined transmission mode and bus configuration;
performing transitions between states of said finite-state machine for each received set of soft data provided on at a bus;
multiplexing said soft data depending on the state of said finite-state machine to a plurality of buffers; and
writing said multiplexed data into said plurality of buffers;
outputting said buffered soft data from said plurality of buffers within the input buffer to a turbo decoder coupled to the input buffer; and
decoding said soft data by said turbo decoder.

10. An input buffer within a decoder of a radio receiver, the input buffer comprising:
an input bus to receive incoming soft data from a sampler within the radio receiver according a plurality of transmission modes;
a multiplexer coupled to the input bus within the input buffer of the decoder, the multiplexor to receive and reorder the incoming soft data to an order that is compatible with a decoder core of the decoder; and
a plurality of buffers coupled to outputs of the multiplexer, wherein the buffers are independently filled to store the reordered soft data;
a configuration register to store transmission mode information for each of the plurality of transmission modes;
a finite-state machine coupled to the configuration register to receive control information for a specific transmission mode, the finite-state machine to control the multiplexer to reorder the incoming soft data according to a multiplexing scheme compatible with the specific transmission mode indicated by the control information provided by the configuration register.

11. The input buffer according to claim 10, wherein transmission mode information provided by the configuration register to the finite-state machine comprises information for a bus configuration, a transmission mode, and a transmission rate.

12. The input buffer according to claim 10, wherein each of the buffers is configured to allow the decoder core to access and decode the reordered soft data.

13. The input buffer according to claim 10, further comprising a plurality of address and control generators, wherein each address and control generator is coupled to the finite-state machine and a corresponding buffer, wherein the finite-state machine is further configured to control the address and control generators to set or not set address incrementers and write enable signals for the corresponding buffers.

* * * * *